(12) United States Patent
Wehrly, Jr. et al.

(10) Patent No.: US 7,508,069 B2
(45) Date of Patent: Mar. 24, 2009

(54) MANAGED MEMORY COMPONENT

(75) Inventors: James Douglas Wehrly, Jr., Austin, TX (US); Ron Orris, Austin, TX (US); Leland Szewerenko, Austin, TX (US); Tim Roy, Driftwood, TX (US); Julian Partridge, Austin, TX (US); David L. Roper, Austin, TX (US)

(73) Assignee: Entorian Technologies, LP, Austin, TX (US)

( * ) Notice: Subject to any disclaimer, the term of this patent is extended or adjusted under 35 U.S.C. 154(b) by 425 days.

(21) Appl. No.: 11/436,946

(22) Filed: May 18, 2006

(65) Prior Publication Data

US 2007/0159545 A1    Jul. 12, 2007

Related U.S. Application Data

(63) Continuation-in-part of application No. 11/330,307, filed on Jan. 11, 2006.

(51) Int. Cl.
 *H01L 23/34* (2006.01)
(52) U.S. Cl. .................... 257/723; 257/777
(58) Field of Classification Search ................ 257/723, 257/777
See application file for complete search history.

(56) References Cited

U.S. PATENT DOCUMENTS

| | | | |
|---|---|---|---|
| 3,436,604 A | 4/1969 | Hyltin | |
| 3,654,394 A | 4/1972 | Gordon | |
| 3,704,455 A | 11/1972 | Scarbrough | |
| 3,746,934 A | 7/1973 | Stein | |
| 3,766,439 A | 10/1973 | Isaacson | |
| 3,772,776 A | 11/1973 | Weisenburger | |
| 3,983,547 A | 9/1976 | Almasi | |
| 4,288,841 A | 9/1981 | Gogal | |
| 4,398,235 A | 8/1983 | Lutz et al. | |
| 4,406,508 A | 9/1983 | Sadigh-Behzadi | |
| 4,437,235 A | 3/1984 | McIver | |
| 4,513,368 A | 4/1985 | Houseman | |
| 4,567,543 A | 1/1986 | Miniet | |

(Continued)

OTHER PUBLICATIONS

PCT/US07/65009 International Search Report and Written Opinion, PCT, Mar. 4, 2008.

(Continued)

*Primary Examiner*—Thien F Tran
(74) *Attorney, Agent, or Firm*—Fish & Richardson P.C.

(57) ABSTRACT

The present invention provides a system and method for combining a leaded package IC and a semiconductor die using a flex circuitry to reduce footprint for the combination. A leaded IC package is disposed along the obverse side of a flex circuit. In a preferred embodiment, leads of the leaded IC package are configured to allow the lower surface of the body of the leaded IC package to contact the surface of the flex circuitry either directly or indirectly through an adhesive. A semiconductor die is connected to the reverse side of the flex circuit. In one embodiment, the semiconductor die is disposed on the reverse side of the flex while, in an alternative embodiment, the semiconductor die is disposed into a window in the flex circuit to rest directly or indirectly upon the body of the leaded IC package. Module contacts are provided in a variety of configurations. In a preferred embodiment, the leaded IC package is a flash memory and the semiconductor die is a controller.

27 Claims, 18 Drawing Sheets

U.S. PATENT DOCUMENTS

| | | |
|---|---|---|
| 4,587,596 A | 5/1986 | Bunnell |
| 4,645,944 A | 2/1987 | Uya |
| 4,656,605 A | 4/1987 | Clayton |
| 4,682,207 A | 7/1987 | Akasaki et al. |
| 4,696,525 A | 9/1987 | Coller et al. |
| 4,709,300 A | 11/1987 | Landis |
| 4,733,461 A | 3/1988 | Nakano |
| 4,758,875 A | 7/1988 | Fujisawa et al. |
| 4,763,188 A | 8/1988 | Johnson |
| 4,821,007 A | 4/1989 | Fields et al. |
| 4,823,234 A | 4/1989 | Konishi et al. |
| 4,833,568 A | 5/1989 | Berhold |
| 4,850,892 A | 7/1989 | Clayton et al. |
| 4,862,249 A | 8/1989 | Carlson |
| 4,884,237 A | 11/1989 | Mueller et al. |
| 4,891,789 A | 1/1990 | Quattrini et al. |
| 4,894,706 A | 1/1990 | Sato et al. |
| 4,911,643 A | 3/1990 | Perry et al. |
| 4,953,060 A | 8/1990 | Lauffer et al. |
| 4,956,694 A | 9/1990 | Eide |
| 4,972,580 A | 11/1990 | Nakamura |
| 4,982,265 A | 1/1991 | Watanabe et al. |
| 4,983,533 A | 1/1991 | Go |
| 4,985,703 A | 1/1991 | Kaneyama |
| 5,012,323 A | 4/1991 | Farnworth |
| 5,016,138 A | 5/1991 | Woodman |
| 5,025,306 A | 6/1991 | Johnson et al. |
| 5,034,350 A | 7/1991 | Marchisi |
| 5,041,015 A | 8/1991 | Travis |
| 5,050,039 A | 9/1991 | Edfors |
| 5,053,853 A | 10/1991 | Haj-Ali-Ahmadi et al. |
| 5,065,277 A | 11/1991 | Davidson |
| 5,081,067 A | 1/1992 | Shimizu et al. |
| 5,099,393 A | 3/1992 | Bentlage et al. |
| 5,104,820 A | 4/1992 | Go et al. |
| 5,117,282 A | 5/1992 | Salatino |
| 5,122,862 A | 6/1992 | Kajihara et al. |
| 5,138,430 A | 8/1992 | Gow et al. |
| 5,140,405 A | 8/1992 | King et al. |
| 5,159,434 A | 10/1992 | Kohno et al. |
| 5,159,535 A | 10/1992 | Desai et al. |
| 5,191,404 A | 3/1993 | Wu et al. |
| 5,198,888 A | 3/1993 | Sugano et al. |
| 5,198,965 A | 3/1993 | Curtis et al. |
| 5,208,729 A | 5/1993 | Cipolla et al. |
| 5,219,794 A | 6/1993 | Satoh et al. |
| 5,222,014 A | 6/1993 | Lin |
| 5,224,023 A | 6/1993 | Smith et al. |
| 5,229,916 A | 7/1993 | Frankeny et al. |
| 5,229,917 A | 7/1993 | Harris et al. |
| 5,239,198 A | 8/1993 | Lin et al. |
| 5,241,454 A | 8/1993 | Ameen et al. |
| 5,241,456 A | 8/1993 | Marcinkiewiez et al. |
| 5,243,133 A | 9/1993 | Engle et al. |
| 5,247,423 A | 9/1993 | Lin et al. |
| 5,252,857 A | 10/1993 | Kane et al. |
| 5,253,010 A | 10/1993 | Oku et al. |
| 5,259,770 A | 11/1993 | Bates et al. |
| 5,261,068 A | 11/1993 | Gaskins et al. |
| 5,262,927 A | 11/1993 | Chia et al. |
| 5,268,815 A | 12/1993 | Cipolla et al. |
| 5,276,418 A | 1/1994 | Klosowiak et al. |
| 5,279,029 A | 1/1994 | Burns |
| 5,281,852 A | 1/1994 | Normington |
| 5,289,062 A | 2/1994 | Wyland |
| 5,289,346 A | 2/1994 | Carey et al. |
| 5,311,401 A | 5/1994 | Gates et al. |
| 5,313,096 A | 5/1994 | Eide |
| 5,313,097 A | 5/1994 | Haj-Ali-Ahmadi et al. |
| 5,343,075 A | 8/1994 | Nishino |
| 5,345,205 A | 9/1994 | Kornrumpf |
| 5,347,428 A | 9/1994 | Carson et al. |
| 5,361,228 A | 11/1994 | Adachi et al. |
| 5,375,041 A | 12/1994 | McMahon |
| 5,377,077 A | 12/1994 | Burns |
| 5,386,341 A | 1/1995 | Olson et al. |
| 5,390,844 A | 2/1995 | Distefano et al. |
| 5,394,010 A | 2/1995 | Tazawa et al. |
| 5,394,300 A | 2/1995 | Yoshimura |
| 5,394,303 A | 2/1995 | Yamaji |
| 5,397,916 A | 3/1995 | Normington |
| 5,400,003 A | 3/1995 | Kledzik |
| 5,402,006 A | 3/1995 | O'Donley |
| 5,420,751 A | 5/1995 | Burns |
| 5,422,435 A | 6/1995 | Takiar et al. |
| 5,428,190 A | 6/1995 | Stopperan |
| 5,438,224 A | 8/1995 | Papageorge et al. |
| 5,446,620 A | 8/1995 | Burns et al. |
| 5,448,511 A | 9/1995 | Paurus et al. |
| 5,455,740 A | 10/1995 | Burns |
| 5,475,920 A | 12/1995 | Burns et al. |
| 5,477,082 A | 12/1995 | Buckley et al. |
| 5,484,959 A | 1/1996 | Burns |
| 5,491,612 A | 2/1996 | Nicewarner et al. |
| 5,499,160 A | 3/1996 | Burns |
| 5,502,333 A | 3/1996 | Bertin et al. |
| 5,514,907 A | 5/1996 | Moshayedi |
| 5,523,619 A | 6/1996 | McAllister et al. |
| 5,523,695 A | 6/1996 | Lin |
| 5,548,091 A | 8/1996 | DiStefano et al. |
| 5,552,631 A | 9/1996 | McCormick |
| 5,561,591 A | 10/1996 | Burns |
| 5,566,051 A | 10/1996 | Burns |
| 5,572,065 A | 11/1996 | Burns |
| 5,579,207 A | 11/1996 | Hayden et al. |
| 5,588,205 A | 12/1996 | Roane |
| 5,592,364 A | 1/1997 | Roane |
| 5,594,275 A | 1/1997 | Kwon et al. |
| 5,600,541 A | 2/1997 | Bone et al. |
| 5,612,570 A | 3/1997 | Eide et al. |
| 5,625,221 A | 4/1997 | Kim et al. |
| 5,631,807 A | 5/1997 | Griffin |
| 5,642,055 A | 6/1997 | Difrancesco |
| 5,644,161 A | 7/1997 | Burns |
| 5,646,446 A | 7/1997 | Nicewarner et al. |
| 5,654,877 A | 8/1997 | Burns |
| 5,657,537 A | 8/1997 | Saia et al. |
| 5,659,952 A | 8/1997 | Kovac et al. |
| 5,677,566 A | 10/1997 | King et al. |
| 5,677,569 A | 10/1997 | Choi et al. |
| 5,714,802 A | 2/1998 | Cloud et al. |
| 5,715,144 A | 2/1998 | Ameen et al. |
| 5,729,894 A | 3/1998 | Rostoker et al. |
| 5,744,862 A | 4/1998 | Ishii |
| 5,751,553 A | 5/1998 | Clayton |
| 5,754,409 A | 5/1998 | Smith |
| 5,764,497 A | 6/1998 | Mizumo |
| 5,776,797 A | 7/1998 | Nicewarner et al. |
| 5,778,522 A | 7/1998 | Burns |
| 5,778,552 A | 7/1998 | LeGuin |
| 5,783,464 A | 7/1998 | Burns |
| 5,789,815 A | 8/1998 | Tessier et al. |
| 5,801,437 A | 9/1998 | Burns |
| 5,801,439 A | 9/1998 | Fujisawa et al. |
| 5,804,870 A | 9/1998 | Burns |
| 5,805,422 A | 9/1998 | Otake et al. |
| 5,805,424 A | 9/1998 | Purinton |
| 5,811,879 A | 9/1998 | Akram |
| 5,835,988 A | 11/1998 | Ishii |
| 5,844,168 A | 12/1998 | Schueller et al. |
| 5,861,666 A | 1/1999 | Bellaar |
| 5,869,353 A | 2/1999 | Levy et al. |
| 5,899,705 A | 5/1999 | Akram |
| 5,917,242 A | 6/1999 | Ball |

| | | | | | | |
|---|---|---|---|---|---|---|
| 5,917,709 | A | 6/1999 | Johnson et al. | 6,339,254 B1 | 1/2002 | Venkateshwaran et al. |
| 5,925,934 | A | 7/1999 | Lim | 6,351,029 B1 | 2/2002 | Isaak |
| 5,926,369 | A | 7/1999 | Ingraham et al. | 6,360,433 B1 | 3/2002 | Ross |
| 5,949,657 | A | 9/1999 | Karabatsos | 6,368,896 B2 | 4/2002 | Farnworth et al. |
| 5,953,214 | A | 9/1999 | Dranchak et al. | 6,376,769 B1 | 4/2002 | Chung |
| 5,953,215 | A | 9/1999 | Karabatsos | 6,388,333 B1 | 5/2002 | Taniguchi et al. |
| 5,959,839 | A | 9/1999 | Gates | 6,392,162 B1 | 5/2002 | Karabatsos |
| 5,963,427 | A | 10/1999 | Bolleson | 6,392,953 B2 | 5/2002 | Yamada et al. |
| 5,973,395 | A | 10/1999 | Suzuki et al. | 6,404,043 B1 | 6/2002 | Isaak |
| 5,977,640 | A | 11/1999 | Bertin et al. | 6,404,049 B1 | 6/2002 | Shibamoto et al. |
| 5,995,370 | A | 11/1999 | Nakamori | 6,410,857 B1 | 6/2002 | Gonya |
| 6,002,167 | A | 12/1999 | Hatano et al. | 6,414,384 B1 | 7/2002 | Lo et al. |
| 6,002,589 | A | 12/1999 | Perino et al. | 6,426,240 B2 | 7/2002 | Isaak |
| 6,013,948 | A | 1/2000 | Akram et al. | 6,426,549 B1 | 7/2002 | Isaak |
| 6,014,316 | A | 1/2000 | Eide | 6,428,360 B2 | 8/2002 | Hassanzadeh |
| 6,021,048 | A | 2/2000 | Smith | 6,433,418 B1 | 8/2002 | Fujisawa et al. |
| 6,025,642 | A | 2/2000 | Burns | 6,437,990 B1 | 8/2002 | Degani et al. |
| 6,028,352 | A | 2/2000 | Eide | 6,444,490 B2 | 9/2002 | Bertin et al. |
| 6,028,358 | A | 2/2000 | Suzuki | 6,444,921 B1 | 9/2002 | Wang et al. |
| 6,028,365 | A | 2/2000 | Akram et al. | 6,446,158 B1 | 9/2002 | Karabatsos |
| 6,030,856 | A | 2/2000 | DiStefano et al. | 6,449,159 B1 | 9/2002 | Haba |
| 6,034,878 | A | 3/2000 | Osaka et al. | 6,452,826 B1 | 9/2002 | Kim et al. |
| 6,040,624 | A | 3/2000 | Chambers et al. | 6,462,408 B1 | 10/2002 | Wehrly, Jr. |
| 6,072,233 | A | 6/2000 | Corisis et al. | 6,462,412 B2 | 10/2002 | Kamei et al. |
| 6,080,264 | A | 6/2000 | Ball | 6,462,421 B1 | 10/2002 | Hsu et al. |
| 6,084,293 | A | 7/2000 | Ohuchi | 6,465,877 B1 | 10/2002 | Farnworth et al. |
| 6,084,294 | A | 7/2000 | Tomita | 6,465,893 B1 | 10/2002 | Khandros et al. |
| 6,084,778 | A | 7/2000 | Malhi | 6,472,735 B2 | 10/2002 | Isaak |
| 6,091,145 | A | 7/2000 | Clayton | 6,473,308 B2 | 10/2002 | Forthun |
| 6,097,087 | A | 8/2000 | Farnworth et al. | 6,486,544 B1 | 11/2002 | Hashimoto |
| 6,104,089 | A | 8/2000 | Akram | 6,489,178 B2 | 12/2002 | Coyle et al. |
| 6,121,676 | A | 9/2000 | Solberg | 6,489,687 B1 | 12/2002 | Hashimoto |
| RE36,916 | E | 10/2000 | Moshayedi | 6,492,718 B2 | 12/2002 | Ohmori |
| 6,133,640 | A | 10/2000 | Leedy | 6,504,104 B2 | 1/2003 | Hacke et al. |
| 6,137,164 | A | 10/2000 | Yew et al. | 6,509,639 B1 | 1/2003 | Lin |
| 6,157,541 | A | 12/2000 | Hacke | 6,514,793 B2 | 2/2003 | Isaak |
| 6,166,443 | A | 12/2000 | Inaba et al. | 6,514,794 B2 | 2/2003 | Haba et al. |
| 6,172,418 | B1 | 1/2001 | Iwase | 6,521,530 B2 | 2/2003 | Peters et al. |
| 6,172,874 | B1 | 1/2001 | Bartilson | 6,522,018 B1 | 2/2003 | Tay et al. |
| 6,180,881 | B1 | 1/2001 | Isaak | 6,522,022 B2 | 2/2003 | Murayama |
| 6,187,652 | B1 | 2/2001 | Chou et al. | 6,525,413 B1 | 2/2003 | Cloud et al. |
| 6,205,654 | B1 | 3/2001 | Burns | 6,528,870 B2 | 3/2003 | Fukatsu et al. |
| 6,208,521 | B1 | 3/2001 | Nakatsuka | 6,531,337 B1 | 3/2003 | Akram et al. |
| 6,214,641 | B1 | 4/2001 | Akram | 6,531,338 B1 | 3/2003 | Akram et al. |
| 6,222,737 | B1 | 4/2001 | Ross | 6,532,162 B2 | 3/2003 | Schoenborn |
| 6,222,739 | B1 | 4/2001 | Bhakta et al. | 6,552,910 B1 | 4/2003 | Moon et al. |
| 6,225,688 | B1 | 5/2001 | Kim et al. | 6,560,117 B2 | 5/2003 | Moon |
| 6,232,659 | B1 | 5/2001 | Clayton | 6,563,217 B2 | 5/2003 | Corisis et al. |
| 6,233,650 | B1 | 5/2001 | Johnson et al. | 6,572,387 B2 | 6/2003 | Burns et al. |
| 6,234,820 | B1 | 5/2001 | Perino et al. | 6,573,593 B1 | 6/2003 | Syri et al. |
| 6,239,496 | B1 | 5/2001 | Asada | 6,576,992 B1 | 6/2003 | Cady et al. |
| 6,262,476 | B1 | 7/2001 | Vidal | 6,583,502 B2 | 6/2003 | Lee et al. |
| 6,262,895 | B1 | 7/2001 | Forthun | 6,590,282 B1 | 7/2003 | Wang et al. |
| 6,265,660 | B1 | 7/2001 | Tandy | 6,600,222 B1 | 7/2003 | Levardo |
| 6,265,766 | B1 | 7/2001 | Moden | 6,603,198 B2 | 8/2003 | Akram et al. |
| 6,266,252 | B1 | 7/2001 | Karabatsos | 6,608,763 B1 | 8/2003 | Burns et al. |
| 6,268,649 | B1 | 7/2001 | Corisis et al. | 6,614,664 B2 | 9/2003 | Lee |
| 6,281,577 | B1 | 8/2001 | Oppermann et al. | 6,620,651 B2 | 9/2003 | He et al. |
| 6,288,924 | B1 | 9/2001 | Sugano et al. | 6,627,984 B2 | 9/2003 | Bruce et al. |
| 6,294,406 | B1 | 9/2001 | Bertin et al. | 6,646,335 B2 | 11/2003 | Emoto |
| 6,300,163 | B1 | 10/2001 | Akram | 6,646,936 B2 | 11/2003 | Hamamatsu |
| 6,300,679 | B1 | 10/2001 | Mukerji et al. | 6,650,588 B2 | 11/2003 | Yamagata |
| 6,303,981 | B1 | 10/2001 | Moden | 6,657,134 B2 | 12/2003 | Spielberger et al. |
| 6,303,997 | B1 | 10/2001 | Lee | 6,660,561 B2 | 12/2003 | Forthun |
| 6,310,392 | B1 | 10/2001 | Burns | 6,661,092 B2 | 12/2003 | Shibata et al. |
| 6,313,522 | B1 | 11/2001 | Akram et al. | 6,673,651 B2 | 1/2004 | Ohuchi et al. |
| 6,313,998 | B1 | 11/2001 | Kledzik | 6,674,644 B2 | 1/2004 | Schulz |
| 6,316,825 | B1 | 11/2001 | Park et al. | 6,677,670 B2 | 1/2004 | Kondo |
| 6,316,838 | B1 | 11/2001 | Ozawa et al. | 6,683,377 B1 | 1/2004 | Shim et al. |
| 6,323,060 | B1 | 11/2001 | Isaak | 6,686,656 B1 | 2/2004 | Koh et al. |
| 6,329,708 | B1 | 12/2001 | Komiyama | 6,690,584 B2 | 2/2004 | Uzuka et al. |
| 6,329,713 | B1 | 12/2001 | Farquhar et al. | 6,699,730 B2 | 3/2004 | Kim et al. |
| 6,336,262 | B1 | 1/2002 | Dalal et al. | 6,707,684 B1 | 3/2004 | Andric et al. |

| Patent | Date | Inventor |
|---|---|---|
| 6,710,437 B2 | 3/2004 | Takahashi et al. |
| 6,712,226 B1 | 3/2004 | Williams, Jr. |
| 6,720,652 B2 | 4/2004 | Akram et al. |
| 6,726,346 B2 | 4/2004 | Shoji |
| 6,737,742 B2 | 5/2004 | Sweterlitsch |
| 6,737,891 B2 | 5/2004 | Karabatsos |
| 6,740,981 B2 | 5/2004 | Hosomi |
| 6,746,894 B2 | 6/2004 | Fee et al. |
| 6,756,661 B2 | 6/2004 | Tsuneda et al. |
| 6,759,737 B2 | 7/2004 | Seo et al. |
| 6,760,220 B2 | 7/2004 | Canter et al. |
| 6,765,288 B2 | 7/2004 | Damberg |
| 6,768,660 B2 | 7/2004 | Kong et al. |
| 6,774,475 B2 | 8/2004 | Blackshear et al. |
| 6,777,794 B2 | 8/2004 | Nakajima |
| 6,781,240 B2 | 8/2004 | Choi et al. |
| 6,788,560 B2 | 9/2004 | Sugano et al. |
| 6,798,057 B2 | 9/2004 | Bolkin et al. |
| 6,812,567 B2 | 11/2004 | Kim et al. |
| 6,815,818 B2 | 11/2004 | Moore et al. |
| 6,826,066 B2 | 11/2004 | Kozaru |
| 6,833,984 B1 | 12/2004 | Belgacem |
| 6,838,761 B2 | 1/2005 | Karnezos |
| 6,839,266 B1 | 1/2005 | Garrett et al. |
| 6,841,868 B2 | 1/2005 | Akram et al. |
| 6,849,949 B1 | 2/2005 | Lyu et al. |
| 6,850,414 B2 | 2/2005 | Benisek et al. |
| 6,853,064 B2 | 2/2005 | Bolken et al. |
| 6,858,910 B2 | 2/2005 | Coyle et al. |
| 6,869,825 B2 | 3/2005 | Chiu |
| 6,873,039 B2 | 3/2005 | Beroz et al. |
| 6,876,074 B2 | 4/2005 | Kim |
| 6,878,571 B2 | 4/2005 | Isaak et al. |
| 6,884,653 B2 | 4/2005 | Larson |
| 6,893,897 B2 | 5/2005 | Sweterlitsch |
| 6,897,565 B2 | 5/2005 | Pflughaupt et al. |
| 6,906,416 B2 | 6/2005 | Karnezos |
| 6,908,792 B2 | 6/2005 | Bruce et al. |
| 6,910,268 B2 | 6/2005 | Miller |
| 6,913,949 B2 | 7/2005 | Pflughaupt et al. |
| 6,914,324 B2 | 7/2005 | Rapport et al. |
| 6,919,626 B2 | 7/2005 | Burns |
| 6,927,471 B2 | 8/2005 | Salmon |
| 6,940,158 B2 | 9/2005 | Haba et al. |
| 6,940,729 B2 | 9/2005 | Cady et al. |
| 6,943,454 B1 | 9/2005 | Gulachenski et al. |
| 6,956,883 B2 | 10/2005 | Komoto |
| 6,972,481 B2 | 12/2005 | Karnezos |
| 6,977,440 B2 | 12/2005 | Pflughaupt et al. |
| 6,978,538 B2 | 12/2005 | DiStefano et al. |
| 6,989,285 B2 | 1/2006 | Ball |
| 7,011,981 B2 | 3/2006 | Kim et al. |
| 7,023,701 B2 | 4/2006 | Stocken et al. |
| 7,053,485 B2 | 5/2006 | Bang et al. |
| 7,053,486 B2 | 5/2006 | Shizuno |
| 7,057,278 B2 | 6/2006 | Naka et al. |
| 7,061,088 B2 | 6/2006 | Karnezos |
| 7,061,121 B2 | 6/2006 | Haba |
| 7,064,122 B2 | 6/2006 | Kim et al. |
| 7,064,426 B2 | 6/2006 | Karnezos |
| 7,071,547 B2 | 7/2006 | Kang et al. |
| 7,078,793 B2 | 7/2006 | Ruckerbauer et al. |
| 7,102,221 B2 | 9/2006 | Miyamoto et al. |
| 7,109,576 B2 | 9/2006 | Bolken et al. |
| 7,115,982 B2 | 10/2006 | Moxham |
| 7,115,986 B2 | 10/2006 | Moon et al. |
| 7,129,571 B2 | 10/2006 | Kang |
| 7,149,095 B2 | 12/2006 | Warner et al. |
| 7,161,237 B2 | 1/2007 | Lee |
| 7,304,382 B2 * | 12/2007 | Wehrly et al. ............... 257/723 |
| 2001/0013423 A1 | 2/2001 | Dalal et al. |
| 2001/0040793 A1 | 11/2001 | Inaba |
| 2002/0006032 A1 | 1/2002 | Karabatsos |
| 2002/0094603 A1 | 7/2002 | Isaak |
| 2002/0196612 A1 | 12/2002 | Gall et al. |
| 2003/0064548 A1 | 4/2003 | Isaak |
| 2003/0090879 A1 | 5/2003 | Doblar et al. |
| 2003/0116835 A1 | 6/2003 | Miyamoto et al. |
| 2003/0159278 A1 | 8/2003 | Peddle |
| 2004/0000707 A1 | 1/2004 | Roper et al. |
| 2004/0075991 A1 | 4/2004 | Haba et al. |
| 2004/0115866 A1 | 6/2004 | Bang et al. |
| 2004/0150107 A1 | 8/2004 | Cha et al. |
| 2004/0217461 A1 | 11/2004 | Damberg |
| 2004/0217471 A1 | 11/2004 | Haba |
| 2004/0245617 A1 | 12/2004 | Damberg et al. |
| 2004/0267409 A1 | 12/2004 | De Lorenzo et al. |
| 2005/0018495 A1 | 1/2005 | Bhakta et al. |
| 2005/0018505 A1 | 1/2005 | Wallace |
| 2005/0035440 A1 | 2/2005 | Mohammed |
| 2005/0040508 A1 | 2/2005 | Lee |
| 2005/0085034 A1 | 4/2005 | Akiba et al. |
| 2005/0108468 A1 | 5/2005 | Hazelzet et al. |
| 2005/0133897 A1 | 6/2005 | Baek et al. |
| 2005/0156297 A1 | 7/2005 | Farnworth et al. |
| 2005/0245060 A1 | 11/2005 | Chiu |
| 2006/0033217 A1 | 2/2006 | Taggart et al. |
| 2006/0050498 A1 | 3/2006 | Cady et al. |
| 2006/0050592 A1 | 3/2006 | Cady et al. |
| 2006/0055024 A1 | 3/2006 | Wehrly |
| 2006/0087013 A1 | 4/2006 | Hsieh |
| 2006/0091521 A1 | 5/2006 | Cady et al. |

OTHER PUBLICATIONS

Demmin, J.C., et al. "Stacked Chip Scale Packages: Manufacturing Issues, Reliability Results, and Costs Analysis," International Electionics Manufacturing Technology Symposium, San Jose, California, Jul. 17, 2003, [retrieved Oct. 22, 2007 Retrieved from the Internet. <URL: http://www.touchbriefings.com/pdf/23/gsc032_t_tessera.pdf> , entire document (especially p. 2, col. 1, para 1-2 and fig 1).

Koh, W., "A System in Package Technology Applications," IEEE 2005 6th International Conference on Electronic Packaging Technology [retrieved Oct. 22, 2007] Retrieved from the Internet. <URL: http//ieeexplore.ieee.org/xpl/freeabs_all.jsp?arnumber=1564753>, entire doc (especially p. 3, col. 1, para 1-2 and fig 3-4, 6-8, 14).

PCT/US07/64407 International Search Report and Written Opinion, PCT, Feb. 25, 2008.

* cited by examiner

MANAGED MEMORY COMPONENT

RELATED APPLICATIONS

The present application is a continuation-in-part of U.S. patent application Ser. No. 11/330,307, filed Jan. 11, 2006, pending.

TECHNICAL FIELD

This invention relates to integrated circuit modules and, in particular, to integrated circuit modules that provide memory and controller in a compact footprint module.

BACKGROUND

A variety of systems and techniques are known for combining integrated circuits in compact modules. Some techniques are suitable for combining packaged integrated circuits while other techniques are suitable for combining semiconductor die. Many systems and techniques employ flex circuitry as a connector between packaged integrated circuits in, for example, stacks of packaged leaded or chip-scale integrated circuits. Other techniques employ flex circuitry to "package" semiconductor die and function as a substitute for packaging.

Within the group of technologies that stack packaged integrated circuits, some techniques are devised for stacking chip-scale packaged devices (CSPs) while other systems and methods are better directed to leaded packages such as those that exhibit a set of leads extending from at least one lateral side of a typically rectangular package.

Integrated circuit devices (ICs) are packaged in both chip-scale (CSP) and leaded packages. However, techniques for stacking CSP devices are typically not optimum for stacking leaded devices, just as techniques for leaded device stacking are typically not suitable for CSP devices. Few technologies are, however, directed toward combining packaged integrated circuits with semiconductor die.

Although CSP devices are gaining market share, in many areas, integrated circuits continue to be packaged in high volumes in leaded packages. For example, the well-known flash memory integrated circuit is typically packaged in a leaded package with fine-pitched leads emergent from one or both sides of the package. A common package for flash memory is the thin small outline package commonly known as the TSOP typified by leads emergent from one or more (typically a pair of opposite sides) lateral sides of the package.

Flash memory devices are gaining wide use in a variety of applications. Typically employed with a controller for protocol adaption, flash memory is employed in solid state memory storage applications that are supplanting disk drive technologies. However, when flash memory is employed with controller logic, the application footprint typically expands to accommodate the multiple devices required to provide a module that is readily compatible with most memory subsystem interface requirements. Consequently, what is needed is a memory module that includes a controller logic and flash memory storage without substantial increases in footprint or thickness.

SUMMARY OF THE INVENTION

The present invention provides a system and method for combining a leaded package IC and a semiconductor die using a flex circuitry to reduce the footprint of the combination. A leaded packaged IC is disposed along an obverse side of a flex circuit. In a preferred embodiment, leads of the leaded packaged IC have a configuration that allows the lower surface of the body of the leaded packaged IC to contact the surface of the flex circuitry either directly or indirectly through an adhesive. A semiconductor die is connected to the reverse side of the flex circuit. In one embodiment, the semiconductor die is disposed on the reverse side of the flex while, in an alternative embodiment, the semiconductor die is disposed into a window in the flex circuit to rest upon the body of the leaded packaged IC either directly or indirectly. Module contacts are provided in a variety of configurations. The leaded packaged IC is preferably a flash memory device and the semiconductor die is preferably a controller.

DETAILED DESCRIPTION

Figure 1:
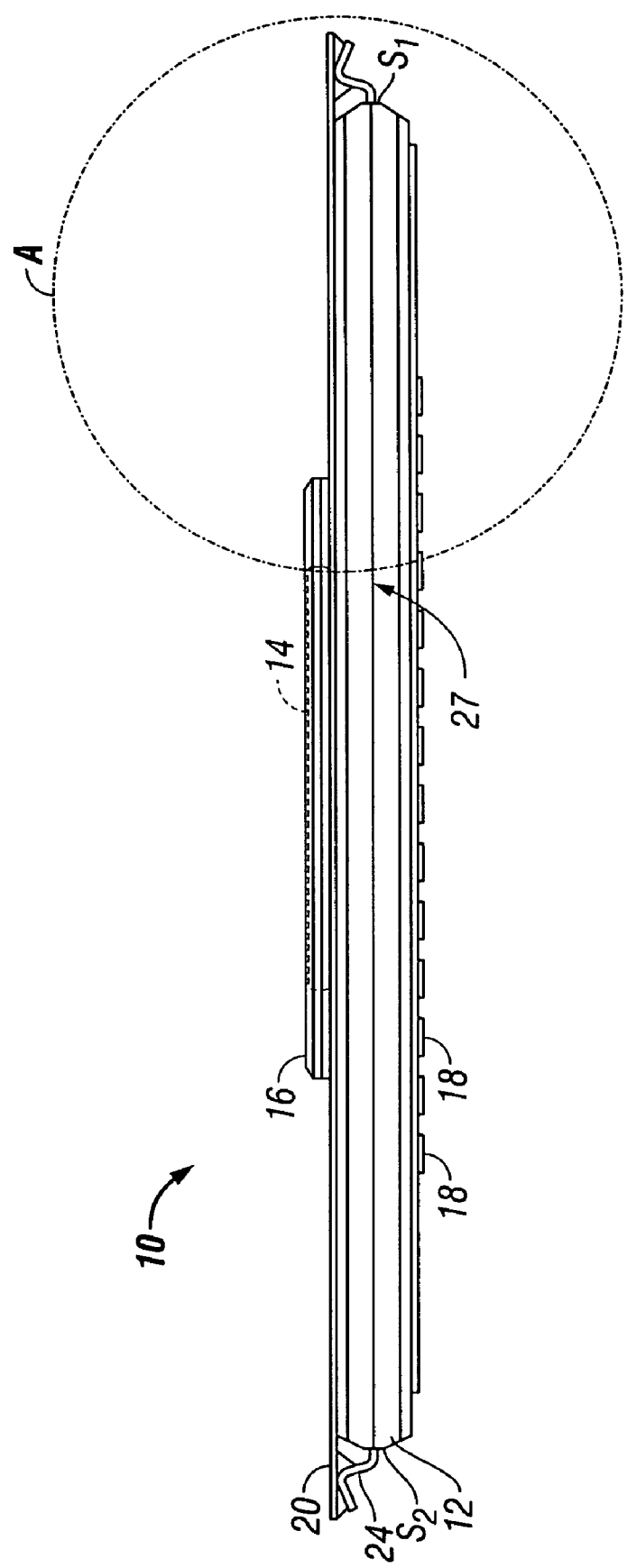
FIG. 1 is a side view of an exemplar module devised in accordance with a preferred embodiment of the present invention.

FIG. 1 is a side view of an exemplar module 10 devised in accordance with a preferred embodiment of the present invention. Exemplar module 10 is comprised of leaded IC 12 and semiconductor die 14 each connected to flex circuitry 20. In preferred embodiments, leaded IC 12 is a flash memory circuit and semiconductor die 14 is a controller. In a preferred embodiment, semiconductor die 14 is covered by an encapsulate 16 as shown.

Figure 2:
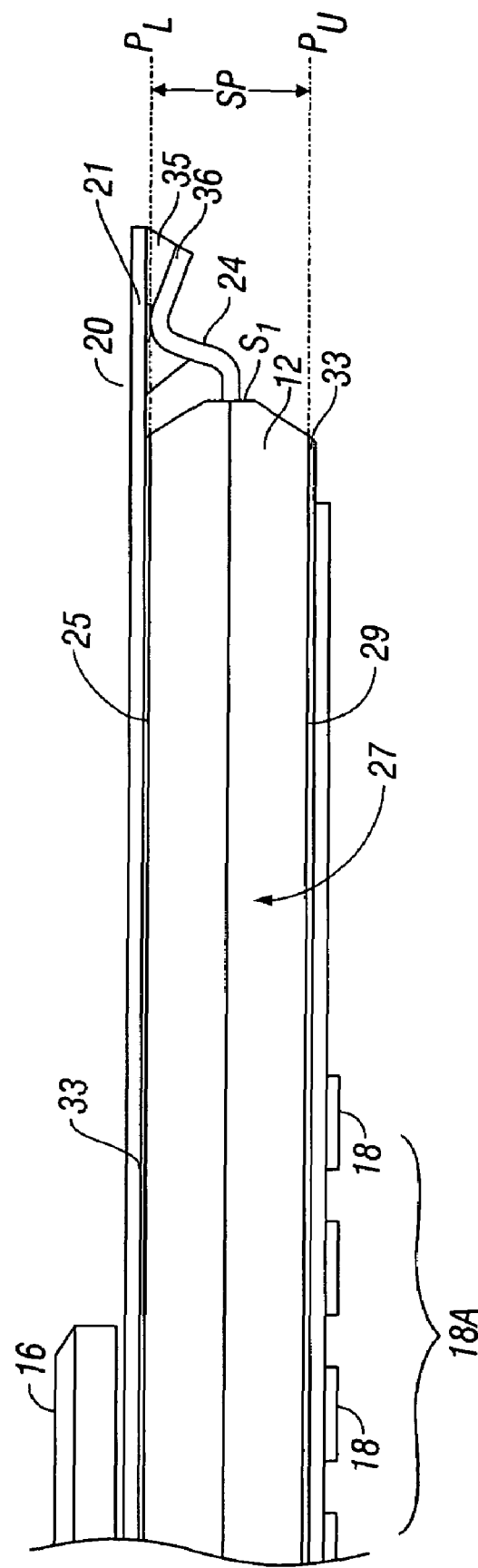
FIG. 2 is an enlarged side view of the area marked "A" in FIG. 1 of a module devised in accordance with a preferred embodiment of the present invention.

FIG. 2 is an enlarged side view of the area marked "A" in FIG. 1 of a module devised in accordance with a preferred embodiment of the present invention. As shown in FIG. 2, leaded packaged IC 12 has upper side 29 and lower side 25 and is connected to flex circuitry 20 through leads 24 that are connected to leaded circuit pads 21 along one side of flex circuitry 20 which is identified as side 11 in later views. Leads 24 typically but not always, exhibit feet 36. Later views will show embodiments in which leads 24 do not exhibit feet 36. Leads 24 may be connected to either or both of the sides of flex circuitry 20 as will be later shown.

Preferably an adhesive 33 is used between body 27 of leaded IC 12 and flex circuit 20. Module contacts 18 which comprise module array 18A are, in the depicted embodiment, pads such as those found in land grid array (LGA) but other types of module contacts 18 may be employed in embodiments of the present invention.

Body 27 of leaded packaged IC 12 has a lower surface 25 that is in contact with flex circuitry 20. In this disclosure, "contact" between the lower surface 25 of leaded packaged IC 12 and the surface of flex circuit 20 includes not only direct contact between lower surface or side 25 of leaded packaged IC 12 and the flex circuitry but shall include those instances where intermediate materials such as depicted adhesive 33 is used between the respective leaded packaged IC and flex circuitry. As shown in FIGS. 1 and 2, leaded packaged IC 12 exhibits lateral sides S1 and S2 which, as those of skill will recognize, may be in the character of edges or sides and need not be perpendicular in aspect to the upper and lower surfaces 29 and 25, respectively. Leads 24 are emergent from sides S1 and S2 in the depicted leaded packaged IC 12 but those of skill will note that some leaded packaged ICs may have leads emergent from only one side or more than two sides. In the embodiment depicted in FIG. 2, leads 24 are configured within space SP defined by planes PL and PU which are defined by lower and upper surfaces 25 and 29, respectively, of the leaded IC to allow the lower surface 25 of the leaded packaged IC 12 to be in contact with the flex circuitry 20 (either directly or indirectly) when leaded packaged IC 12 is connected to the flex.

To realize the contact relationship between the lower side 25 of the leaded packaged IC 12 and the flex circuitry, leads 24 may be modified or reconfigured. This is preferably performed before mounting of the leaded IC to flex circuit 20. Those of skill will note that a preferred method for reconfiguration of leads 24, if desired, comprises use of a jig to fix the position of body 27 of the leaded packaged IC and, preferably, support the lead at the point of emergence from the body at sides S1 and S2 before deflection of the respective leads toward the upper plane PU to confine leads 24 to the space between planes PL and PU of the leaded packaged IC. This is because typically, leaded packaged ICs such as TSOPs are configured with leads that extend beyond the lower plane PL. In order for the lower surface 25 of the respective leaded packaged ICs to contact (either directly or through an adhesive or thermal intermediary, for example) the respective surfaces of the flex circuit, the leads 24 may need to be reconfigured.

Figure 3:
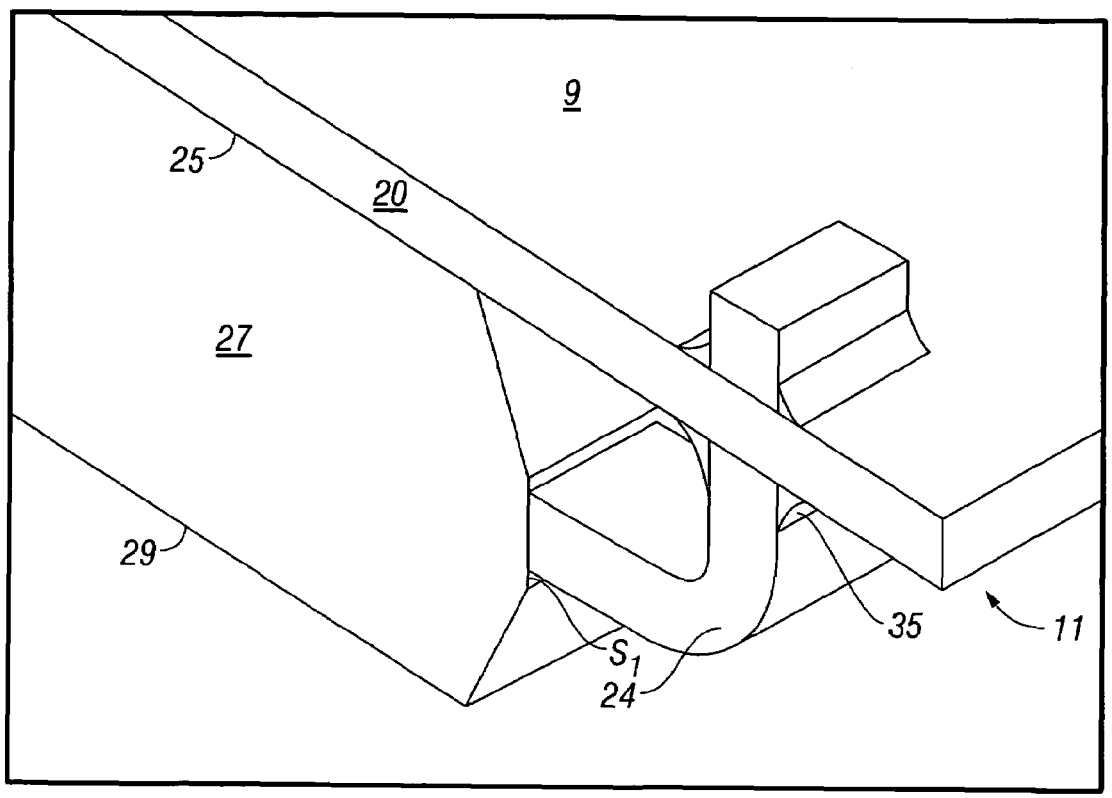
FIG. 3 depicts an alternative embodiment in which the leads of a leaded packaged IC penetrate the flex circuitry employed in an module in accordance with a preferred embodiment of the present invention.

Other configurations of leads 24 may not, however, require or exhibit configurations in which the lead is within space SP and yet lower surface 25 still exhibits contact with flex circuitry 20. For example, in FIG. 3, leaded packaged IC 12 exhibits a straight lead 24 that penetrates flex circuitry 20 and is connected to both sides 9 and 11 of flex circuitry 20 with solder 35.

Figure 4:
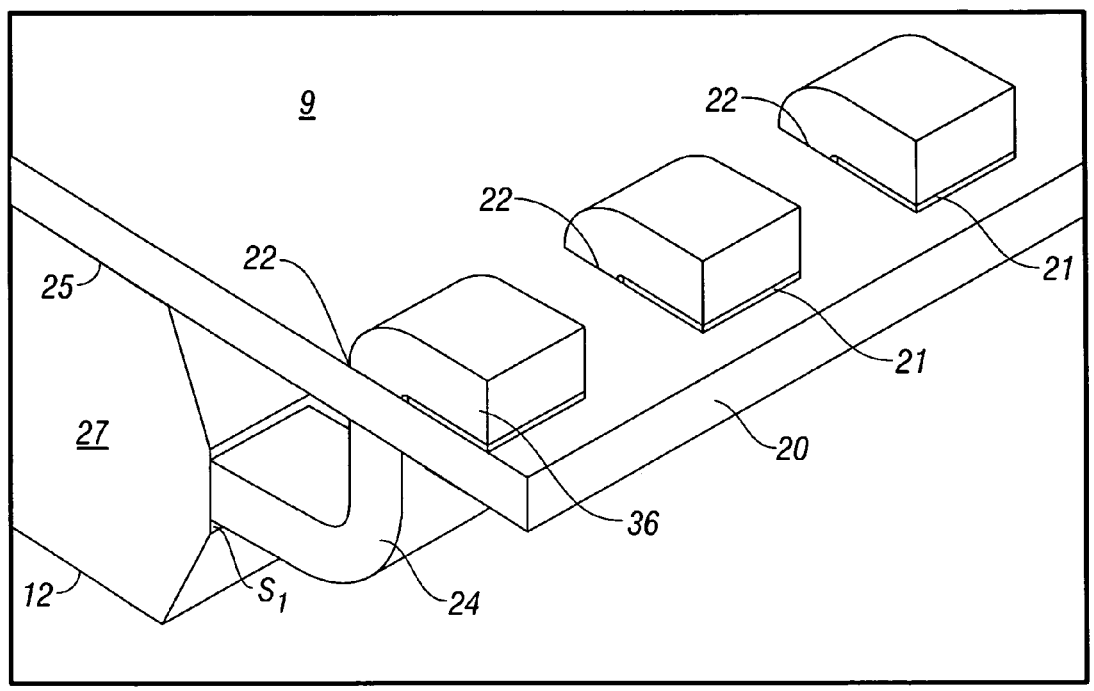
FIG. 4 depicts an alternative embodiment in accord with the present invention in which lead holes are present in the flex circuitry.

FIG. 4 depicts an alternative embodiment in accord with the present invention in which flex circuitry 20 exhibits lead holes 22 through which leads 24 project so that leads 24 may be connected to leaded IC pads 21 which, in this instance, are on side 9 of flex circuitry 20 rather than side 11 as depicted in several other Figs. The result is that lower major surface 25 of leaded packaged IC 12 contacts flex circuitry 20.

Figure 5:
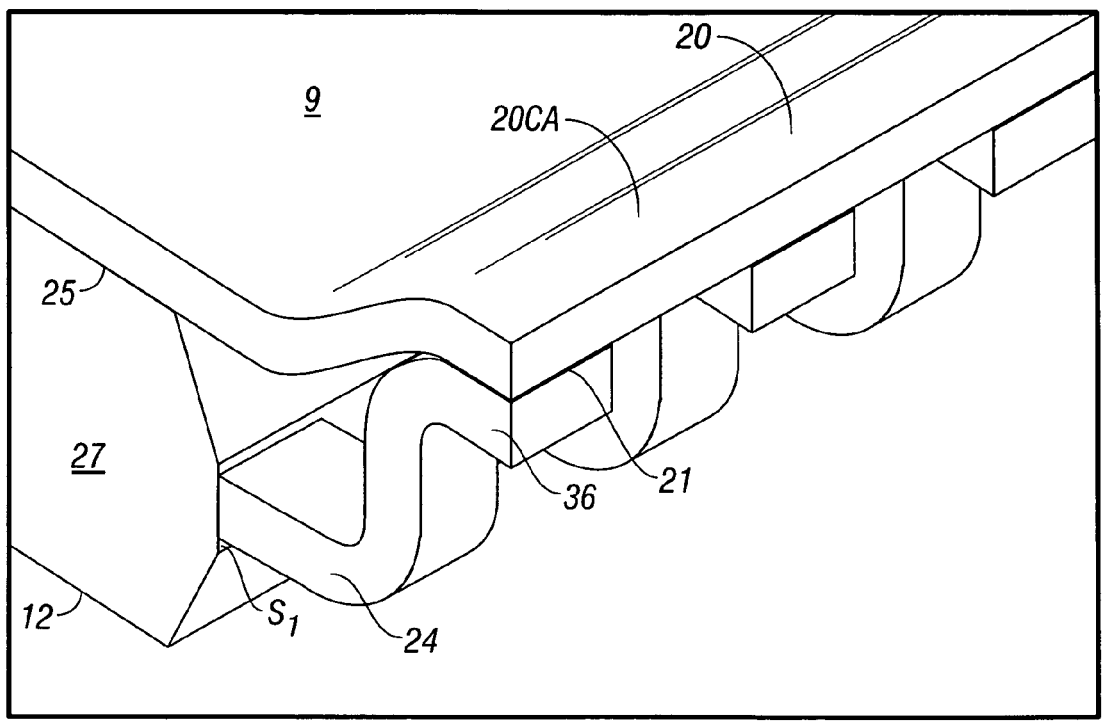
FIG. 5 depicts yet another embodiment in accordance with the present invention in which an area of flex circuitry is deflected.

FIG. 5 depicts yet another technique for connection of leaded packaged IC 12 to flex circuitry 20 while realizing contact between lower surface 25 and flex circuitry 20. As shown in FIG. 5, in this embodiment, an area 20CA of flex circuitry 20 is deflected to allow leads 24 and in particular, feet 36 of leads 24 to be connected to leaded IC pads 21 on side 11 of flex circuitry 20. Again the result is that lower surface 25 of leaded package IC 12 is in contact with flex circuitry 20.

Figure 6:
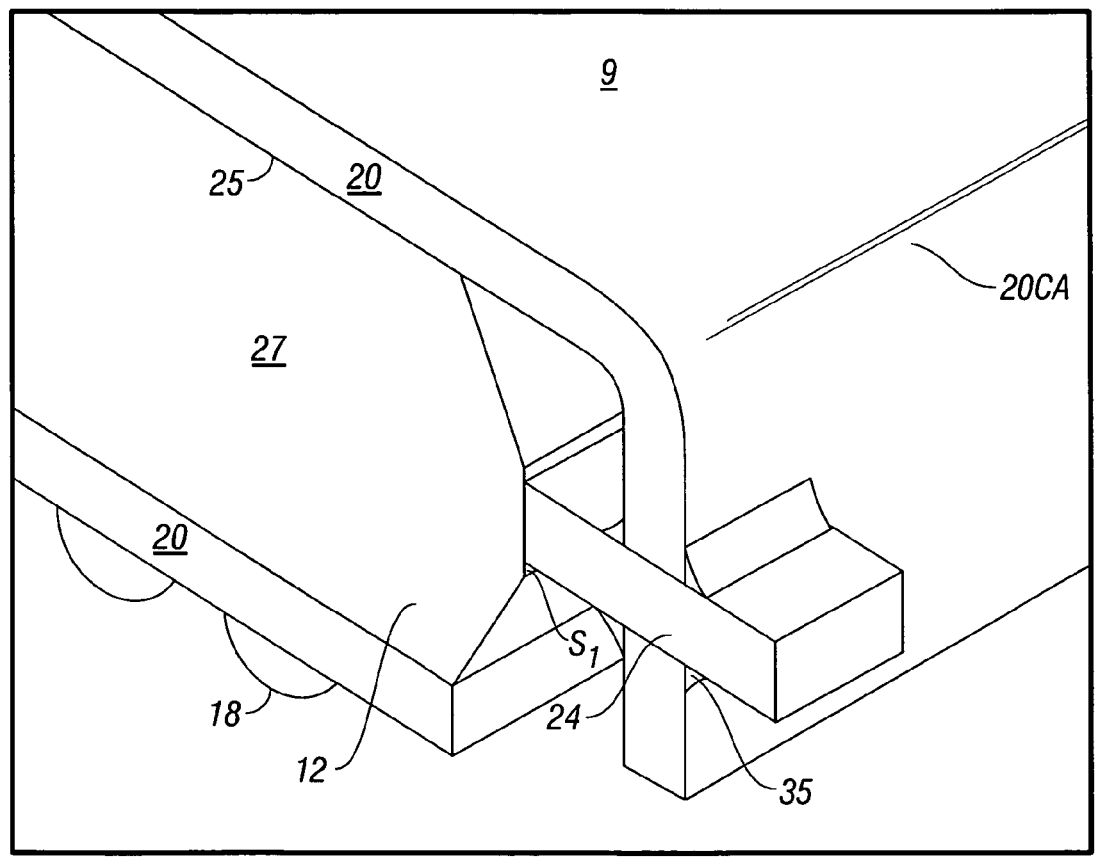
FIG. 6 depicts yet another embodiment for connecting the leaded packaged IC to the flex circuitry in accordance with the present invention.

FIG. 6 depicts yet another technique for connecting leaded packaged IC 12 to flex circuitry 20. In the embodiment depicted in FIG. 6, leads 24 penetrate deflected area 20CA of flex circuitry 20 which, in this embodiment, is deflected toward the body 27 of leaded packaged IC 12 rather than away from leaded packaged IC 12 as shown in earlier FIG. 5. In this depiction, leads 24 are connected to both sides 9 and 11 of flex circuitry 20. Leads 24 are also parallel with lower major surface 25 as shown. Lower major surface 25 of leaded packaged IC is in contact with flex circuitry 20 and, in particular, with side 11 of flex circuitry 20.

Figure 7:
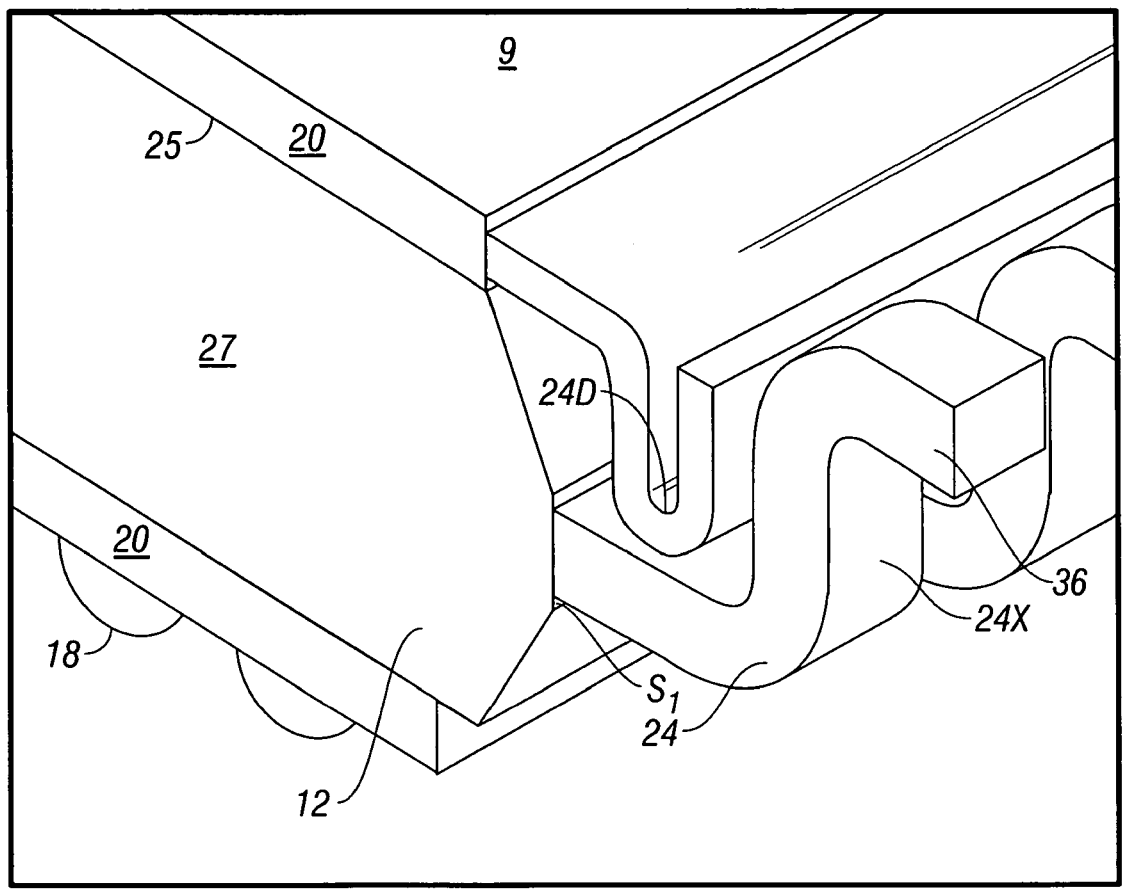
FIG. 7 depicts an alternative embodiment of the present invention in which flex circuitry has distal ends that contact an inner side of the leads of the leaded packaged IC.

FIG. 7 depicts an alternative embodiment of the present invention in which flex circuitry 20 has distal ends 20D that are deflected to contact inner side 24I of leads 24 which has, as shown, an inner side 24I and an external side 24X. Thus, flex circuitry 20 accomodates the configuration of leads 24 and lower surface 25 is in contact with flex circuitry 20.

Figure 8:
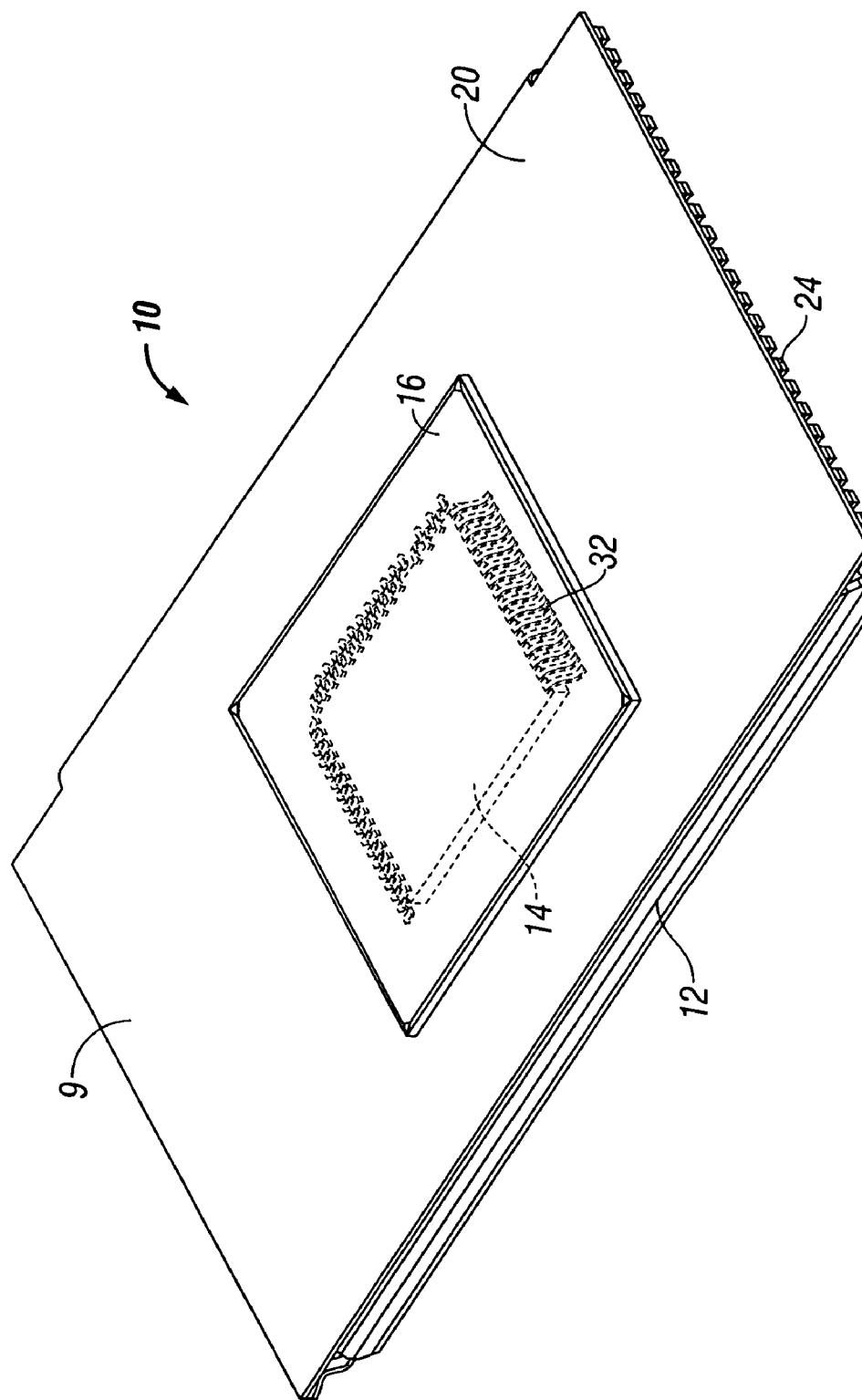
FIG. 8 is a perspective view of a module devised in accordance with an embodiment of the present invention.

FIG. 8 is a perspective view of a module devised in accordance with an embodiment of the present invention. As depicted, semiconductor die 14 is connected through wire bonds 32 to flex circuit 20. As will be later shown, wire bonds 32 are attached to flex pads 20P along surface 9 of flex circuitry 20. Concurrently, leaded packaged IC 12 is connected to the other major side of flex circuitry 20 through leads 24.

Figure 9:
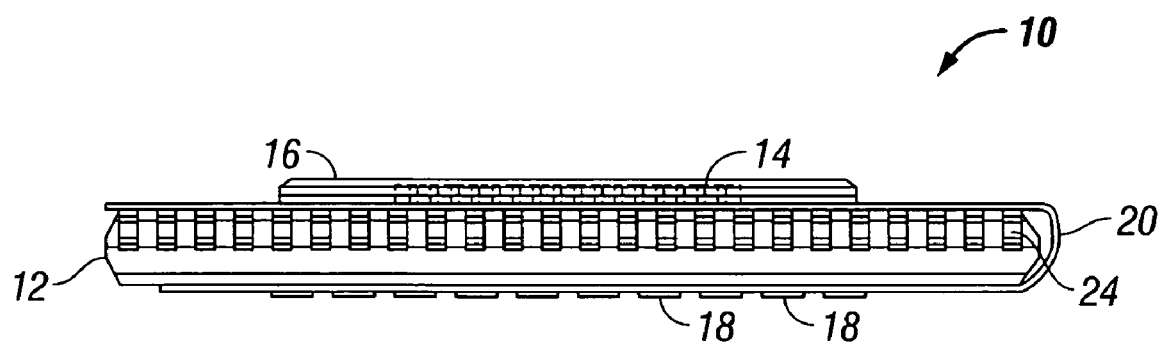
FIG. 9 is a plan view of another side of a circuit module in accordance with an embodiment of the present invention.

FIG. 9 is a side view of an exemplar module 10 devised in accordance with a preferred embodiment of the present invention. Die 14 is shown encapsulated by encapsulate 16. A variety of methods can be employed to effectuate the encapsulation of die 14 and such methods are known to those of skill in the art.

Figure 10:
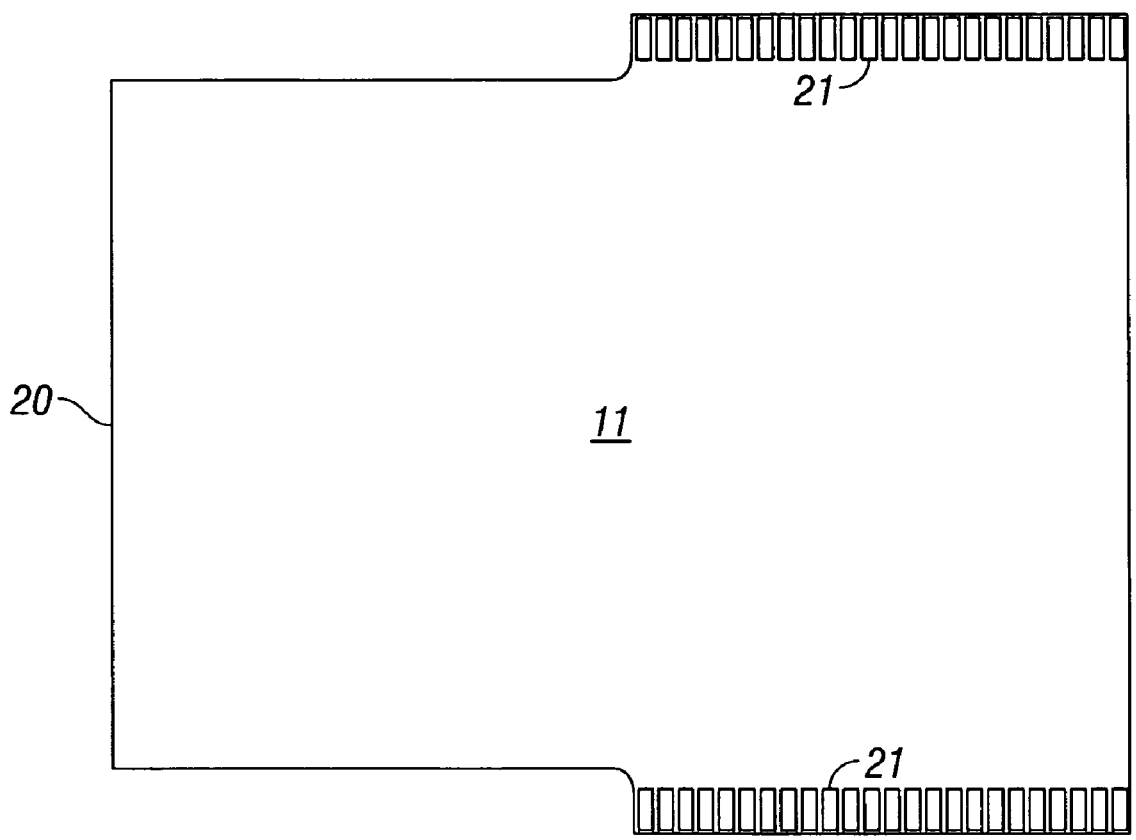
FIG. 10 depicts a major side of a flex circuitry as employed in a preferred embodiment of the present invention.

FIG. 10 depicts a major side 11 of flex circuitry 20 as employed in a preferred embodiment of the present invention. The plurality of leaded IC pads 21 shown along side 11 of flex circuitry 20 provide contact sites for the leads 24 of leaded IC 12. As earlier shown, leaded IC pads 21 need not be on side 11 of flex circuitry 20 if leads 24 reach side 9 of flex circuitry 20 as shown in an earlier Fig. Flex circuitry 20 is preferably comprised from one or more conductive layers supported by one or more flexible substrate layers. The entirety of flex circuitry 20 may be flexible or, as those of skill in the art will recognize, the flexible circuitry may be made flexible in certain areas and rigid in other areas such as those areas where leaded packaged IC 12 is mounted, for example.

Figure 11:
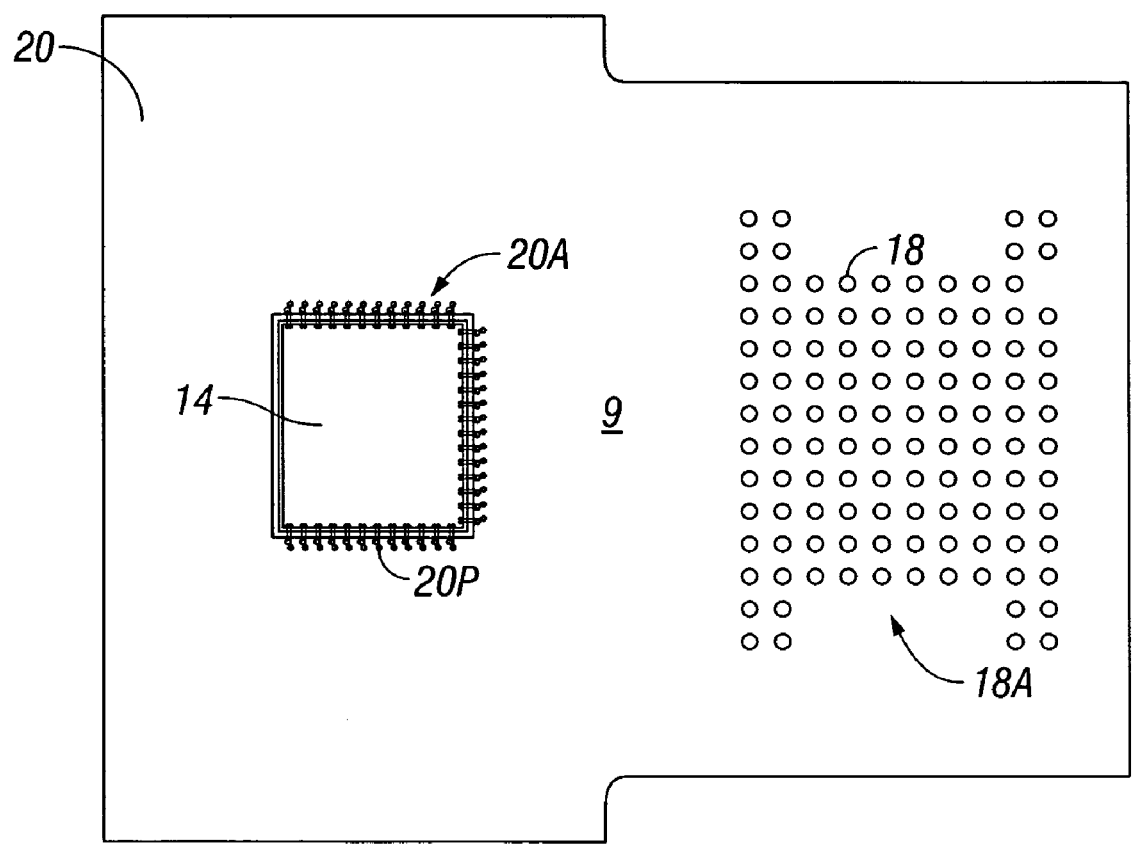
FIG. 11 depicts a second major side of a flex circuitry as employed in a preferred embodiment of the present invention.

FIG. 11 depicts major surface 9 of flex circuit 20 illustrating module contacts array 18A and module contacts 18 as well as mounted semiconductor die 14 wire-bond connected to the plurality 20A of flex pads 20P. In FIG. 11, semiconductor die 14 is depicted as being mounted on the surface of flex circuitry 20. A later alternative embodiment is an example of an embodiment in which semiconductor die 14 is inset into a window in flex circuitry 20.

Figure 12:
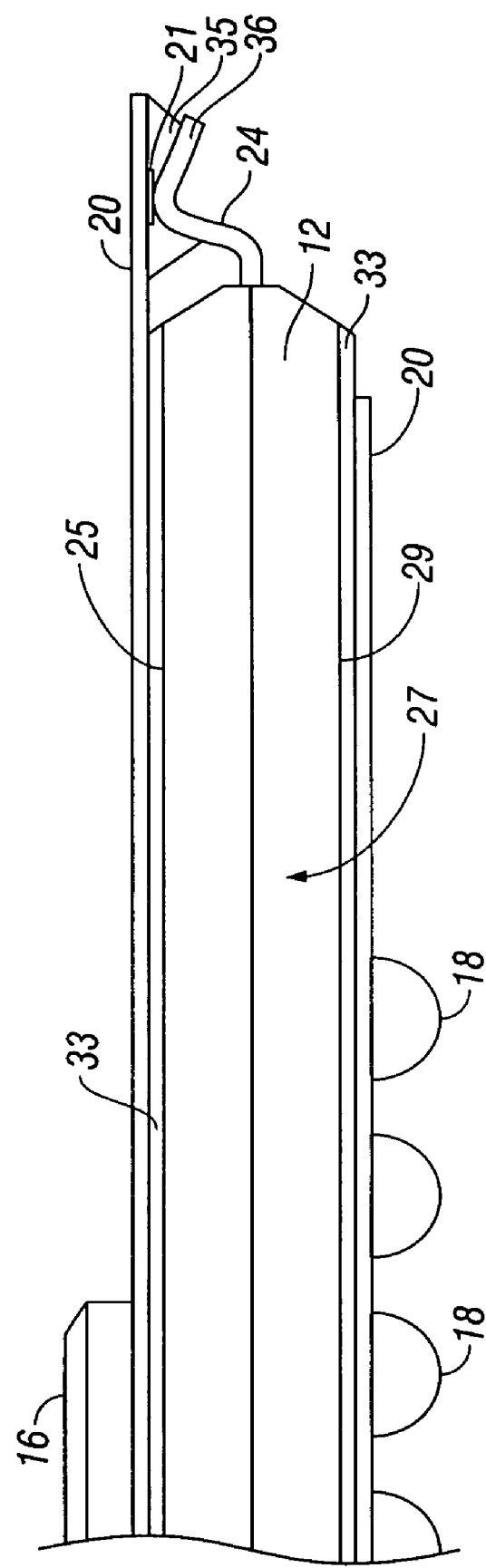
FIG. 12 depicts an enlarged portion of a module devised in accordance with a preferred embodiment.

FIG. 12 depicts an enlarged portion of a module 10 devised in accordance with a preferred embodiment. In the depicted module of FIG. 12, module contacts 18 are illustrated as the commonly understood BGA type contacts often found along the surfaces of CSP devices. Other types of contacts may be employed as module contacts 18.

Figure 13:
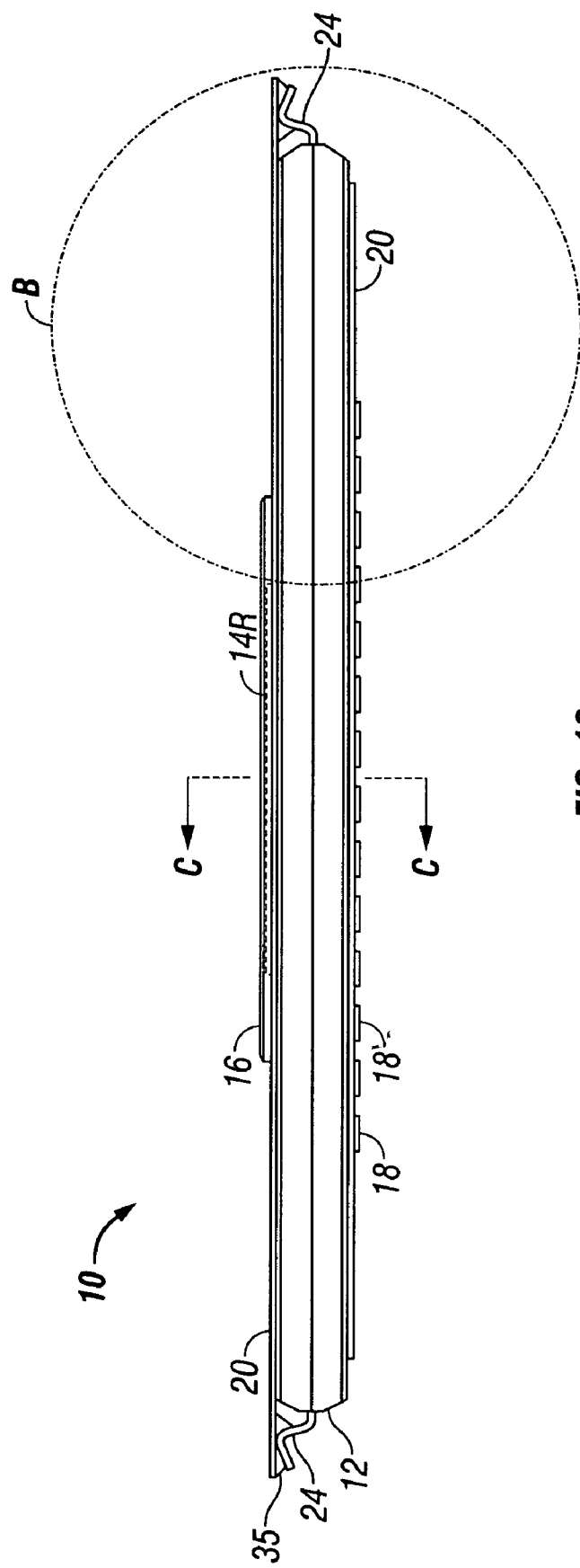
FIG. 13 depicts an exemplar module devised in accordance with an alternative embodiment.

FIG. 13 depicts a module 10 devised in accordance with an alternative embodiment in which semiconductor die 14 is set into a window in flex circuitry 20. In the earlier depicted embodiments, semiconductor die 14 resided on flex circuit 20. In the depicted embodiment of an alternative embodiment, flex circuitry 20 has a window into which is set semiconductor die 14. Thus, in such embodiments, die 14 is not on the surface of flexible circuitry 20 and although it may be connected to either side of flexible circuitry 20, it is shown in enlarged detail in FIG. 16, for example, as being wire-bond connected to the upper surface of flexible circuitry 20 which corresponds to earlier identified major surface 9 of flexible circuitry 20. Consequently, semiconductor die 14 is shown with a lower profile than depicted in earlier depictions of this disclosure. In some Figs., a semiconductor die that is inset into a window in flex circuitry 20 will be identified as die 14R which is, as shown, preferably encapsulated as shown to protect, for example, the wire bonds and the die.

As those of skill will recognize, many techniques exist for connecting the leads of leaded packaged IC 12 to leaded pads 21. Such techniques include, as a non-limiting example, use of solder such as solder 35 shown in several of the preceding Figs., or other conductive attachment. Other forms of bonding other than solder between leaded IC pads 21 and leads 24 may also be employed (such as brazing, welding, tab bonding, or ultrasonic bonding, just as examples) but soldering techniques are well understood and adapted for use in large scale manufacturing.

Figure 14:
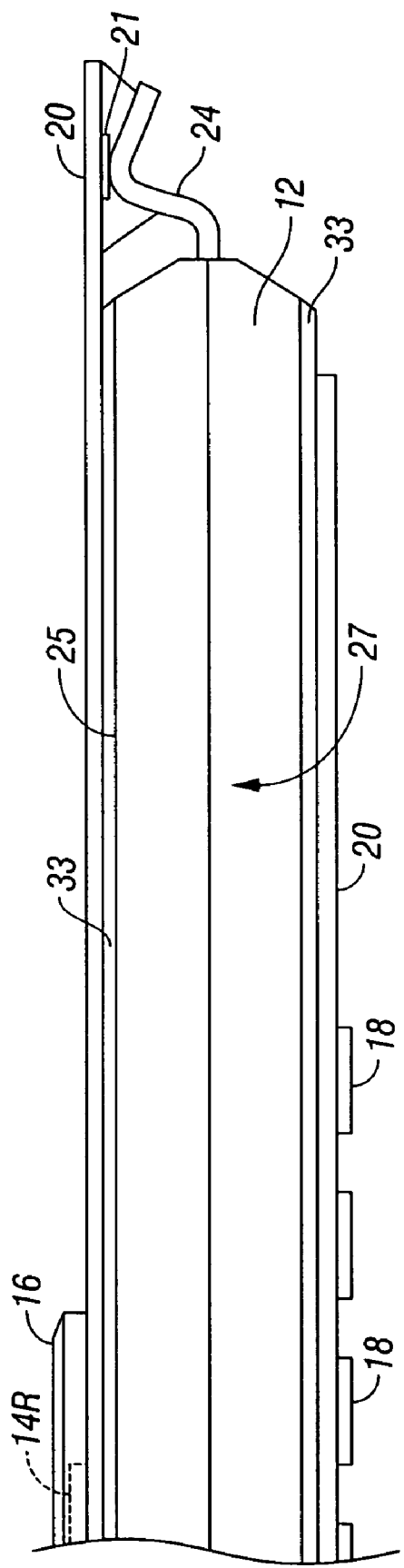
FIG. 14 is an enlarged depiction of a portion of an exemplar module identified in FIG. 13 with the letter "B".

FIG. 14 is an enlarged depiction of a portion of module 10 identified in FIG. 13 with the letter "B". Inset semiconductor die 14R is identified in encapsulate 16 while leaded packaged IC 12 is shown connected to flex circuitry 20 through leads 24 connected to leaded circuit pads 21 of flexible circuitry 20 while both the upper and lower surfaces 29 and 25, respectively, of body 27 of leaded packaged IC 12 are preferably connected to flexible circuitry 20 through adhesive 33. The identification of "upper" and "lower" surfaces or sides of leaded packaged IC 12 is with reference to the normal orientation of the device and typically employed, but such oriented terms are not with reference to a relative "up" or "down" in the Figs. Those of skill will understand, therefore, that the identified upper side 29 is actually seen as being below the lower side 25 of leaded packaged IC 12 in the depiction of, for example, FIG. 14 when that depiction is viewed.

Figure 15:
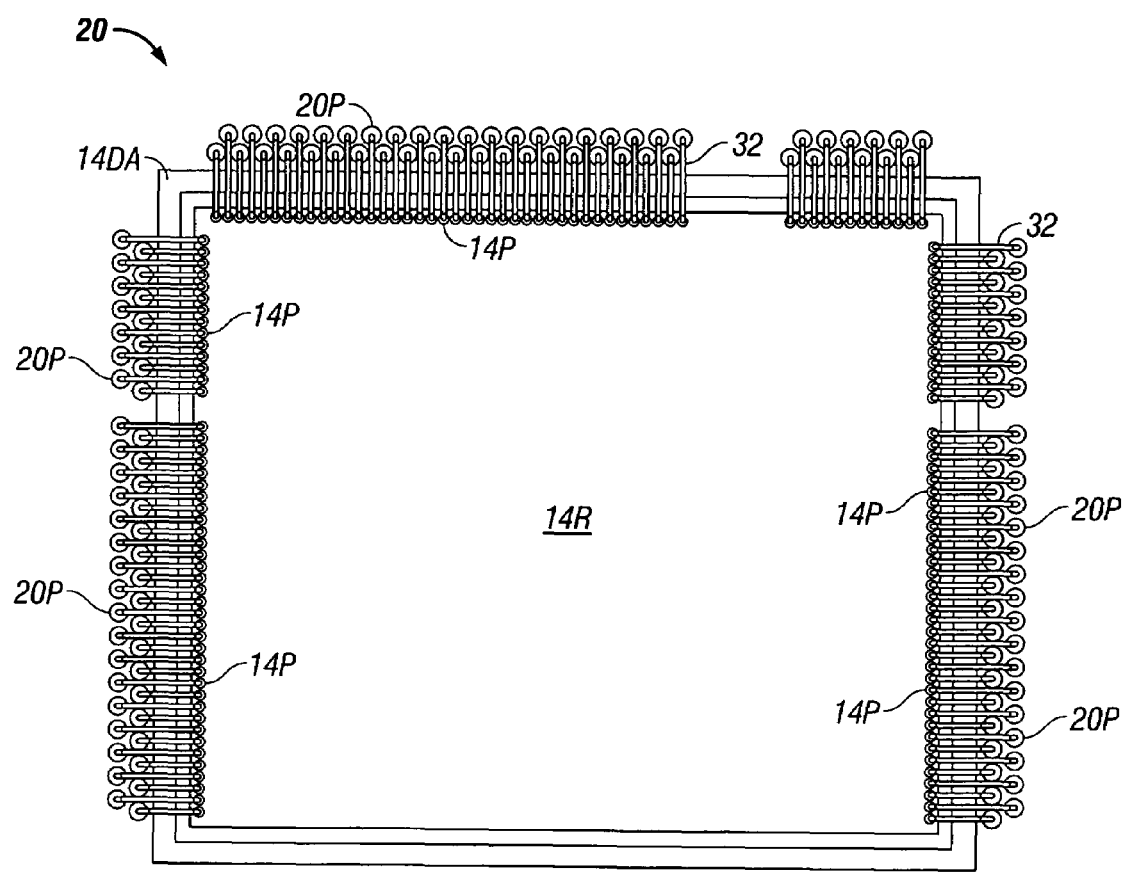
FIG. 15 depicts recessed semiconductor die and illustrates the plural die pads and plural flex pads as well as wire bonds that connect the die to the flex circuitry in a preferred embodiment.

FIG. 15 depicts recessed semiconductor die 14R and illustrates the plural die pads 14P and plural flex pads 20P and the wire bonds 32 that connect die 14R to flex circuit 20. Die attach 14DA is also shown. As those of skill understand, die attach 14DA is typically an adhesive.

Figure 16:
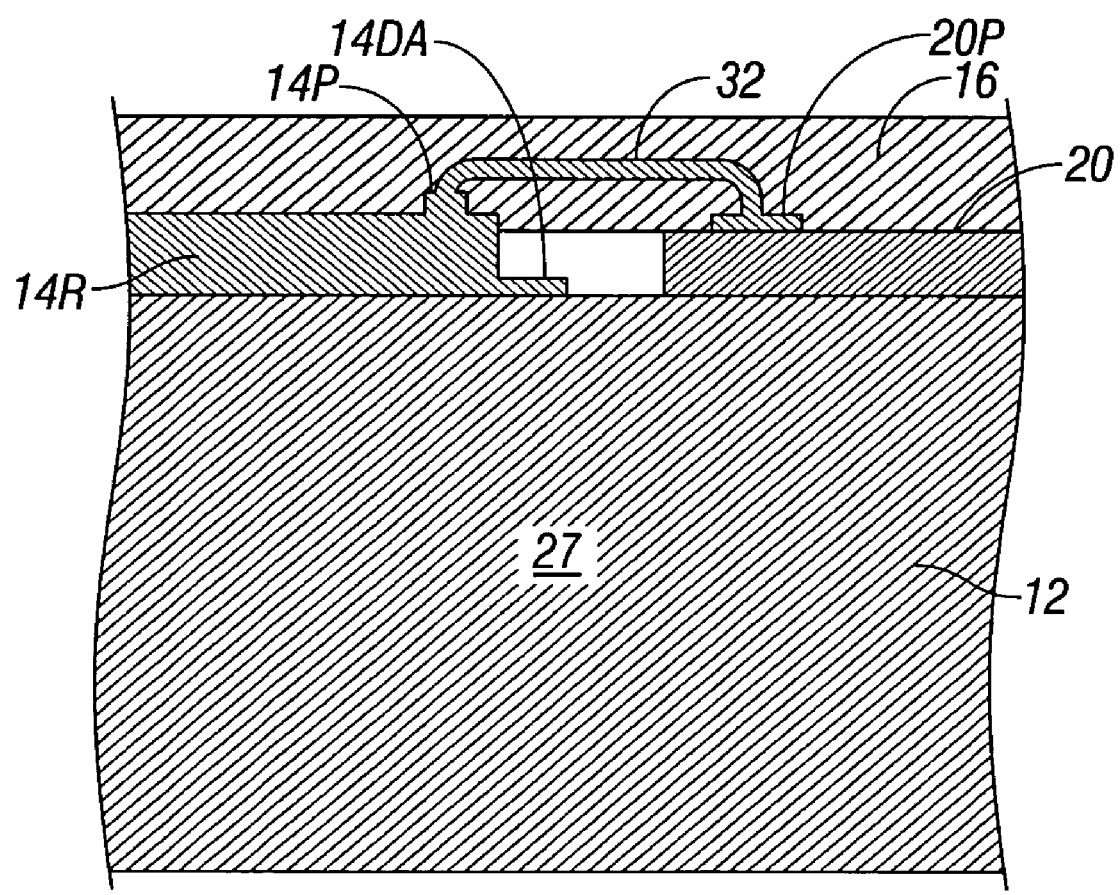
FIG. 16 is an enlarged depiction showing a cross-sectional view along the line identified as C-C in earlier FIG. 13.

FIG. 16 is an enlarged depiction showing a cross-sectional view along the line identified as C-C in earlier FIG. 13. Body 27 of leaded packaged IC 12 is shown supporting recessed semiconductor die 14R which is attached to body 27 through die attach shown as 14DA. Exemplar die pad 14P is connected to flex pad 20P of flexible circuitry 20 through wire bond 32. The entire connection area is preferable encapsulated with encapsulate 16.

Figure 17:
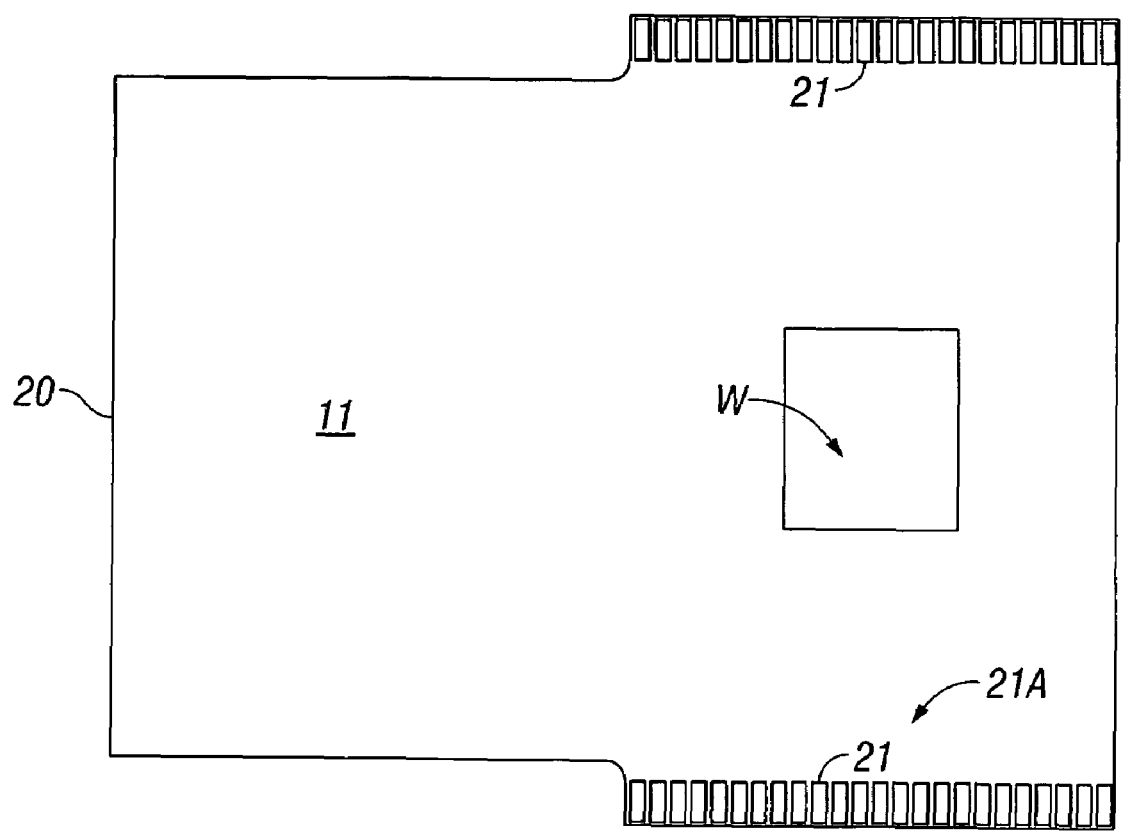
FIG. 17 depicts a flex circuitry prepared for use with an alternative embodiment that recesses semiconductor die in a window in the flex circuitry in accordance with an embodiment of the present invention.

FIG. 17 depicts flex circuitry 20 prepared for use with an alternative embodiment that recesses semiconductor die 14 in a window W in the flex circuitry. Such constructions result in lower profiles for modules 10. Leaded pads 21 are shown along side 11 of flexible circuitry 20.

Figure 18:
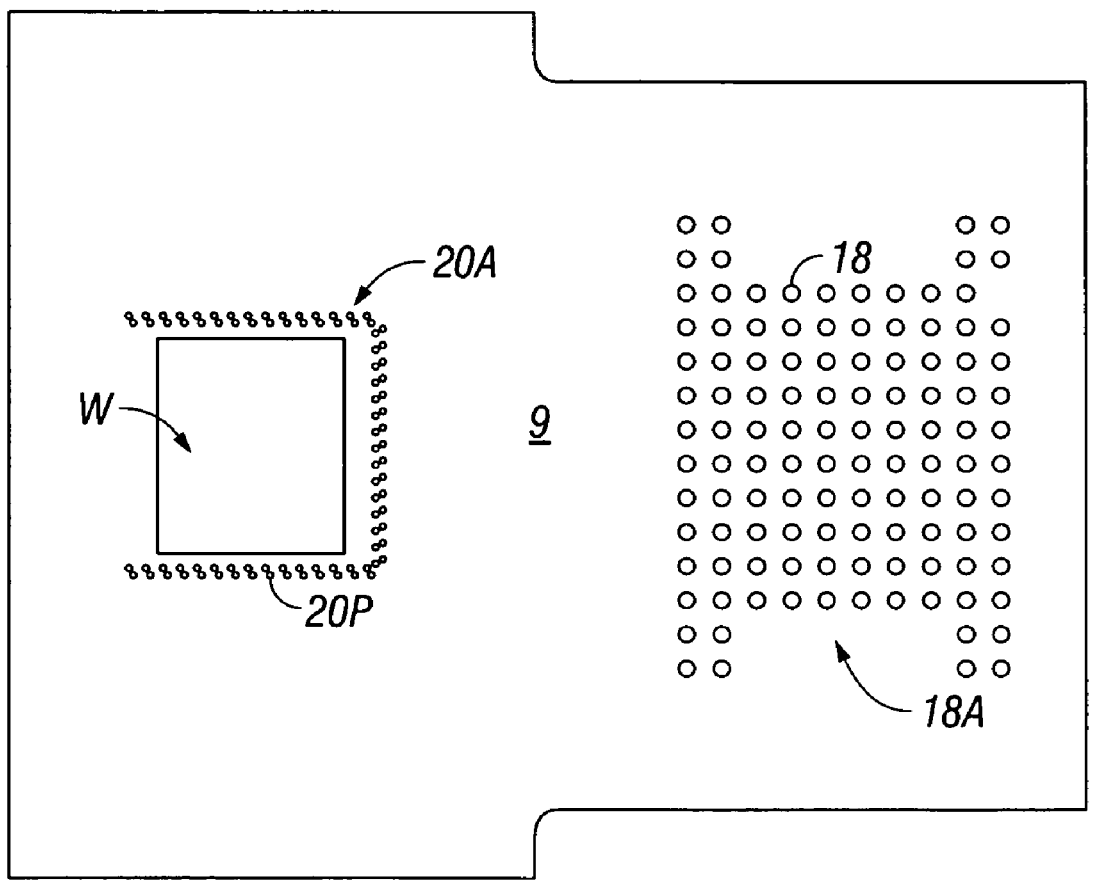
FIG. 18 depicts a flex circuitry prepared for use with a recessed semiconductor die arrangement for an exemplar module in accordance with an embodiment of the present invention.

FIG. 18 depicts flex circuitry 20 prepared for use with a recessed semiconductor die arrangement for module 10. Flexible circuitry pads 20P along side 9 and array 18A of module contacts 18 are shown. Window W provides the space through which die 14 is disposed when a module 10 in accordance with an alternative embodiment is constructed. For sake of clarity, when semiconductor die 14 is recessed in a module 10 it is identified as die 14R, while in those instances where die 14 resides on flex circuitry 20, it is identified as semiconductor die 14. Those of skill will, however, recognize that a die can be used in either mode, recessed in a window W of flex circuitry 20 or on the surface of flex circuitry 20.

The present invention may also be employed with circuitry other than or in addition to memory such as the flash memory depicted in a number of the present Figs. Other exemplar types of circuitry that may be aggregated in accordance with embodiments of the invention include, just as non-limiting examples, DRAMs, FPGAs, and system stacks that include logic and memory as well as communications or graphics devices. It should be noted, therefore, that the depicted profile for leaded packaged IC 12 is not a limitation and that leaded packaged IC 12 does not have to be a TSOP or TSOP-like and the package employed may have more than one die or leads emergent from one, two, three or all sides of the respective package body. For example, a module 10 in accordance with embodiments of the present invention may employ a leaded packaged IC 12 that has more than one die within the package and may exhibit leads emergent from only one side of the package.

It will be seen by those skilled in the art that many embodiments taking a variety of specific forms and reflecting changes, substitutions, and alternations can be made without departing from the spirit and scope of the invention. Therefore, the described embodiments illustrate but do not restrict the scope of the claims.

The invention claimed is:

1. A circuit module comprising:
    flex circuitry having first and second sides, the flex circuitry having a plurality of leaded IC pads adapted for connection of a leaded packaged IC, the second side having an array of module contacts and plural flex pads;
    a semiconductor die disposed on the second side of the flex circuitry, the semiconductor die being connected to the flex circuitry;
    a leaded packaged IC having a body and upper and lower major surfaces, plural peripheral sides, and leads emergent from at least a first one of the plural peripheral sides of the leaded packaged IC, the leads being connected to the plurality of leaded IC pads of the flex circuitry and the lower major surface of the leaded packaged IC contacting the first side of the flex circuitry, the flex circuitry being folded about the body of the leaded packaged IC to place the semiconductor die closer to the lower major side than the upper major side of the leaded packaged IC.

2. The circuit module of claim 1 in which the leads are connected to the leaded IC pads which are disposed on the first side of the flex circuitry.

3. The circuit module of claim 1 in which the leads are connected to the leaded IC pads which are disposed on the second side of the flex circuitry.

4. The circuit module of claim 1 in which the leads pass through the flex circuitry.

5. The circuit module of claim 1 in which the leads are parallel to the lower major surface of the leaded packaged IC.

6. The circuit module of claim 1 in which the leads pass through lead holes in the flex circuitry to contact the leaded IC pads which are disposed on the second side of the flex circuitry.

7. The circuit module of claim 1 in which the flex circuitry further comprises a deflected area that bears the plurality of leaded IC pads.

8. The circuit module of claim 1 in which the flex circuitry further comprises a deflected area that is deflected toward the body of the leaded packaged IC.

9. The circuit module of claim 1 in which the flex circuitry has at least one distal end that contacts an inner side of one of the leads of the leaded packaged IC.

10. The circuit module of claim 1 in which an adhesive is disposed between the lower major surface of the leaded packaged IC and the first side of the flex circuitry.

11. The circuit module of claim 1 in which the leads of the leaded packaged IC have been configured to be confined to a space defined by first and second planes defined by the upper and lower major surfaces of the leaded packaged IC.

12. The circuit module of claim 1 in which the leaded packaged IC is a flash memory device.

13. The circuit module of claim 1 in which the semiconductor die is a controller.

14. The circuit module of claim 1 in which the leaded packaged IC is flash memory circuit in TSOP packaging.

15. The circuit module of claim 1 in which the connection of the semiconductor die with the flex circuitry is realized with wire bonds.

16. The circuit module of claim 1 in which the semiconductor die is encapsulated.

17. The circuit module of claim 1 in which the connection of the semiconductor die with the flex circuitry is realized with wire bonds between die pads of the semiconductor die and the flex pads of the flex circuitry.

18. A circuit module comprising:
flex circuitry having first and second sides, the first side having a plurality of leaded IC pads adapted for connection of a leaded packaged IC, the second side having an array of module contacts and plural flex pads;
a semiconductor die disposed on the flex circuitry and connected to the flex pads; and
a leaded packaged IC having a body and upper and lower major surfaces, plural peripheral sides, and leads emergent from at least a first one of the plural peripheral sides of the leaded packaged IC, the leads being connected to the plurality of leaded IC pads of the first side of the flex circuitry and configured to be confined to a space defined by first and second planes defined by the upper and lower major surfaces of the leaded packaged IC so that the lower major surface of the leaded packaged IC contacts the first side of the flex circuitry, the flex circuitry being folded about the body of the leaded packaged IC to place the flex circuitry bearing the semiconductor die over and proximal to the lower major surface of the leaded packaged IC.

19. The circuit module of claim 18 in which the semiconductor die is a controller.

20. The circuit module of claim 18 in which the leaded packaged IC is a flash memory device.

21. The circuit module of claim 18 in which the contact of the lower major surface of the leaded packaged IC and the semiconductor die is effectuated with an adhesive disposed between the lower major surface of the leaded packaged IC and the first side of the flex circuitry.

22. The circuit module of claim 18 in which the semiconductor die has a face with semiconductor die pads and that face is turned away from the lower major surface of the leaded packaged IC.

23. The circuit module of claim 18 in which there is adhesive between the upper and lower major surfaces of the leaded packaged IC and the flex circuitry.

24. The circuit module of claim 18 in which the leaded packaged IC is a flash memory device and the semiconductor die is a controller.

25. The circuit module of claim 18 in which the semiconductor die is encapsulated.

26. The circuit module of claim 18 in which the semiconductor die is attached to the flex pads with wire bonds.

27. The circuit module of claim 26 in which the wire bonds are protected by encapsulate.

* * * * *